United States Patent
Cho et al.

(10) Patent No.: US 7,999,746 B2
(45) Date of Patent: Aug. 16, 2011

(54) PRINTED CIRCUIT BOARD HAVING BUILT-IN ANTENNA

(75) Inventors: Won-Woo Cho, Busan (KR); Jae-Suk Sung, Yongin-si (KR); Jae-Youb Jung, Daegu (KR); Dek-Gin Yang, Chungcheongbuk-do (KR); Ju-Hyung Kim, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 369 days.

(21) Appl. No.: 12/285,315

(22) Filed: Oct. 1, 2008

(65) Prior Publication Data

US 2009/0140931 A1     Jun. 4, 2009

(30) Foreign Application Priority Data

Dec. 4, 2007  (KR) .................. 10-2007-0124796

(51) Int. Cl.
*H01Q 1/38*     (2006.01)

(52) U.S. Cl. .................. 343/700 MS; 343/702; 343/893
(58) Field of Classification Search .................. None
See application file for complete search history.

(56) References Cited

U.S. PATENT DOCUMENTS

| | | | | |
|---|---|---|---|---|
| 6,114,997 A * | 9/2000 | Lee et al. | ............... | 343/700 MS |
| 7,782,257 B2 * | 8/2010 | Kim et al. | ............... | 343/700 MS |
| 2004/0119647 A1 * | 6/2004 | Harihara | ............... | 343/700 MS |
| 2007/0285335 A1 * | 12/2007 | Bungo et al. | ............... | 343/895 |

FOREIGN PATENT DOCUMENTS

| | | |
|---|---|---|
| JP | 2001-44753 | 2/2001 |
| JP | 2002-158529 | 5/2002 |

OTHER PUBLICATIONS

Korean Office Action issued on Oct. 13, 2009 in corresponding Korean Patent Application No. 10-2007-0124796.

* cited by examiner

*Primary Examiner* — Trinh V Dinh

(57) ABSTRACT

A printed circuit board having a built-in antenna may include a first unit substrate, in which a ground and a first radiator are formed; a second unit substrate, which is stacked over the first unit substrate, and in which a second radiator having a frequency band different from a frequency band of the first radiator is formed; a pair of striplines, formed in the first unit substrate and connected with the ground; a first via, which connects the first radiator with the second radiator; a pair of second vias, each of which has one end connected with the pair of strip lines respectively; and a connection pattern, which connects the other ends of the pair of second vias to each other. The printed circuit board having a built-in antenna can utilize multiple frequency bands, and can be implemented in a compact size, to be applicable in compact communication devices.

3 Claims, 6 Drawing Sheets

PRINTED CIRCUIT BOARD HAVING BUILT-IN ANTENNA

CROSS-REFERENCE TO RELATED APPLICATIONS

This application claims the benefit of Korean Patent Application No. 10-2007-0124796 filed with the Korean Intellectual Property Office on Dec. 4, 2007, the disclosure of which is incorporated herein by reference in its entirety.

BACKGROUND

1. Technical Field

The present invention relates to a printed circuit board, more particularly to a printed circuit board (PCB) having a built-in antenna.

2. Description of the Related Art

The method of implementing an antenna for mobile communication devices according to the related art may include stacking a number of PCB materials, and afterwards, performing plating, mechanically contacting a metallic radiator, or soldering the contact points between the printed circuit board and the antenna, over a dielectric of a polycarbonate material. Due to the demands for lower costs and modularization, however, there is active research under way towards developing the printed circuit board having a built-in antenna.

In the printed circuit board having a built-in antenna, according to the related art, only the upper side or lower side of the board is utilized, to provide the antenna in a two-dimensional structure. This printed circuit board having a built-in antenna implemented in a two-dimensional structure may not pose significant problems in terms of spatial limitations, when it is applied to a wireless mouse having a single frequency band. This is because a single frequency band may not require a large amount of space to achieve a desired radiation efficiency.

In cases where the printed circuit board having a built-in antenna is employed in a mobile communication terminal having multiple frequency bands, however, the sufficient amount of volume necessary for maximizing radiation efficiency may not be obtained. In order to maximize radiation efficiency, the antenna may have to be given a long length. Allotting an adequate amount of space for this may increase the size of the main printed circuit board mounted in the mobile communication terminal, and may thereby lead to an increase in cost of the printed circuit board. The increase in size may also impose limitations to providing a mobile communication terminal of a compact size.

SUMMARY

An aspect of the invention provides a printed circuit board having a built-in antenna, which employs an antenna of a three-dimensional structure, to provide a compact size and enable the use of multiple frequency bands.

Another aspect of the invention provides a printed circuit board having a built-in antenna that includes: a first unit substrate, in which a ground and a first radiator are formed; a second unit substrate, which is stacked over the first unit substrate, and in which a second radiator having a frequency band different from a frequency band of the first radiator is formed; a pair of striplines, which are formed in the first unit substrate and are connected with the ground; a first via, which connects the first radiator with the second radiator; a pair of second vias, each of which has one end connected with the pair of strip lines respectively; and a connection pattern, which connects the other ends of the pair of second vias to each other.

Here, the frequency band of the first radiator may be lower than the frequency band of the second radiator. The printed circuit board can further include a power supply part, which may supply signals to the first radiator and the second radiator.

Additional aspects and advantages of the present invention will be set forth in part in the description which follows, and in part will be obvious from the description, or may be learned by practice of the invention.

DETAILED DESCRIPTION

Figure 1:
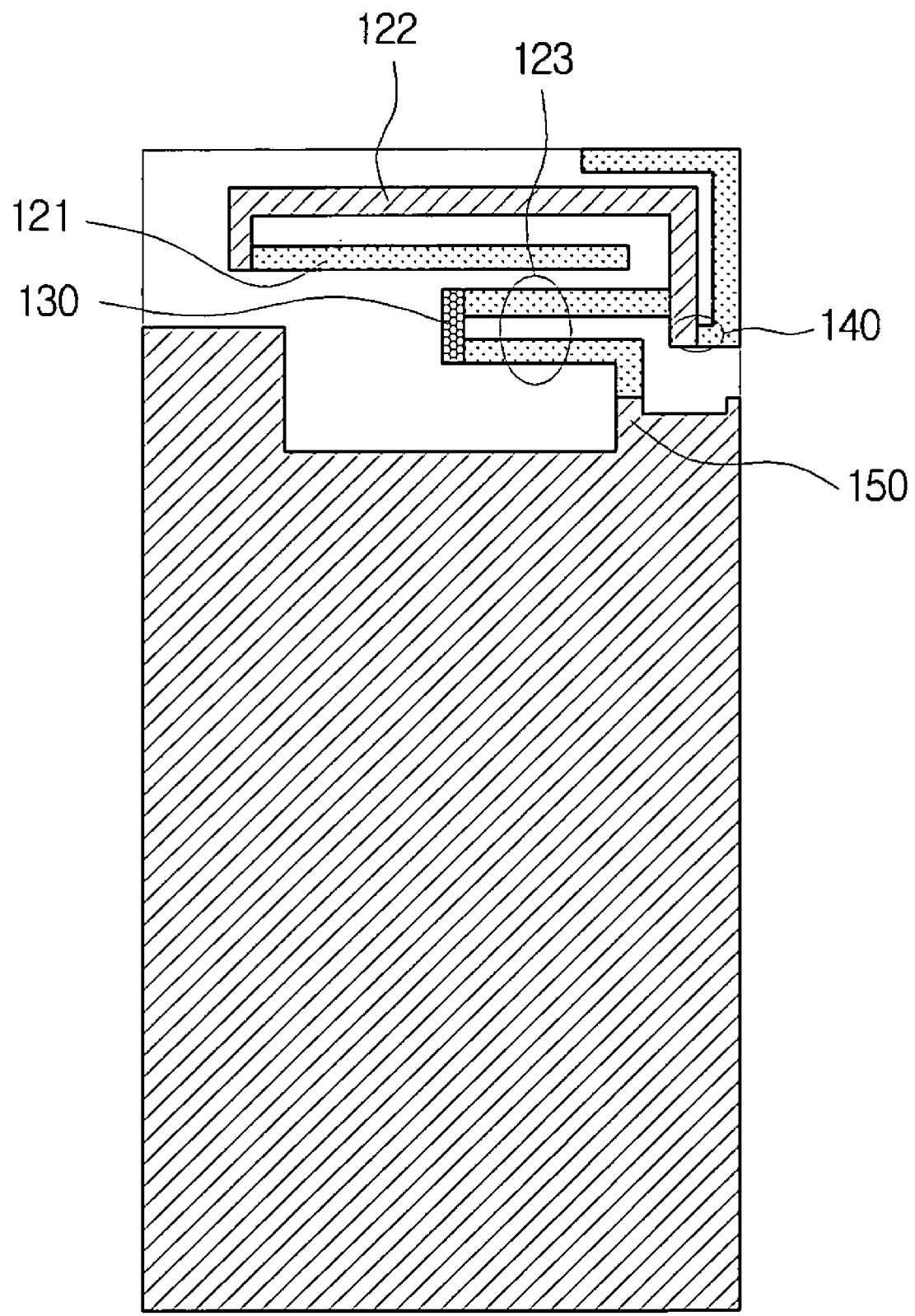
FIG. 1 is a schematic diagram of a printed circuit board having a built-in antenna according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various elements, such elements must not be limited to the above terms. The above terms are used only to distinguish one element from another. For example, a first element may be referred to as a second element without departing from the scope of rights of the present invention, and likewise a second element may be referred to as a first element. The term "and/or" encompasses both combinations of the plurality of related items disclosed and any item from among the plurality of related items disclosed.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have the meanings equal to the contextual meanings in the relevant field of art, and are not to be interpreted to have ideal or excessively formal meanings unless clearly defined in the present application.

Embodiments of the present invention will be described below in detail with reference to the accompanying drawings.

Figure 2:
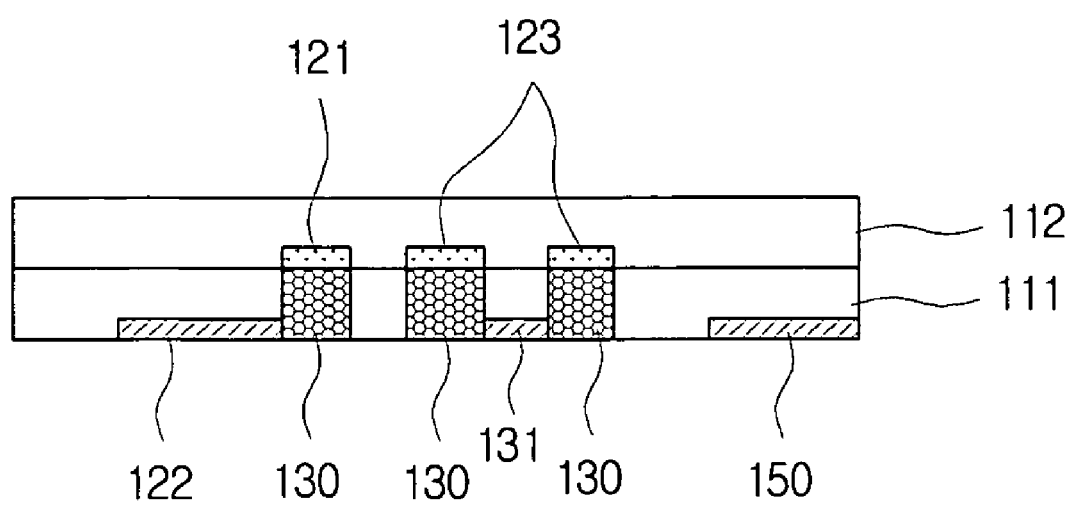
FIG. 2 is a cross-sectional view of a printed circuit board having a built-in antenna according to an embodiment of the invention.
Figure 3:
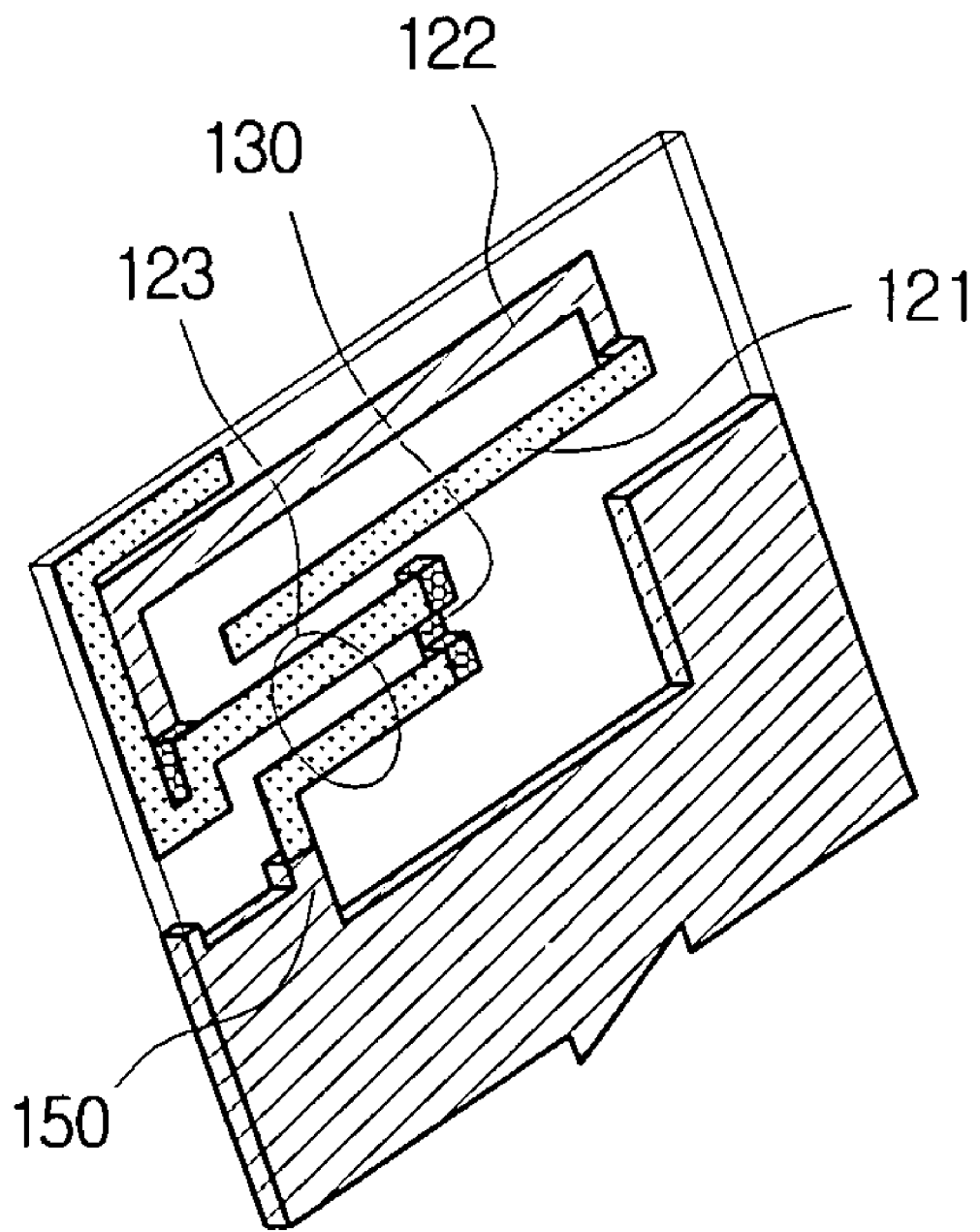
FIG. 3 is a top view of a printed circuit board having a built-in antenna according to an embodiment of the invention.
Figure 4:
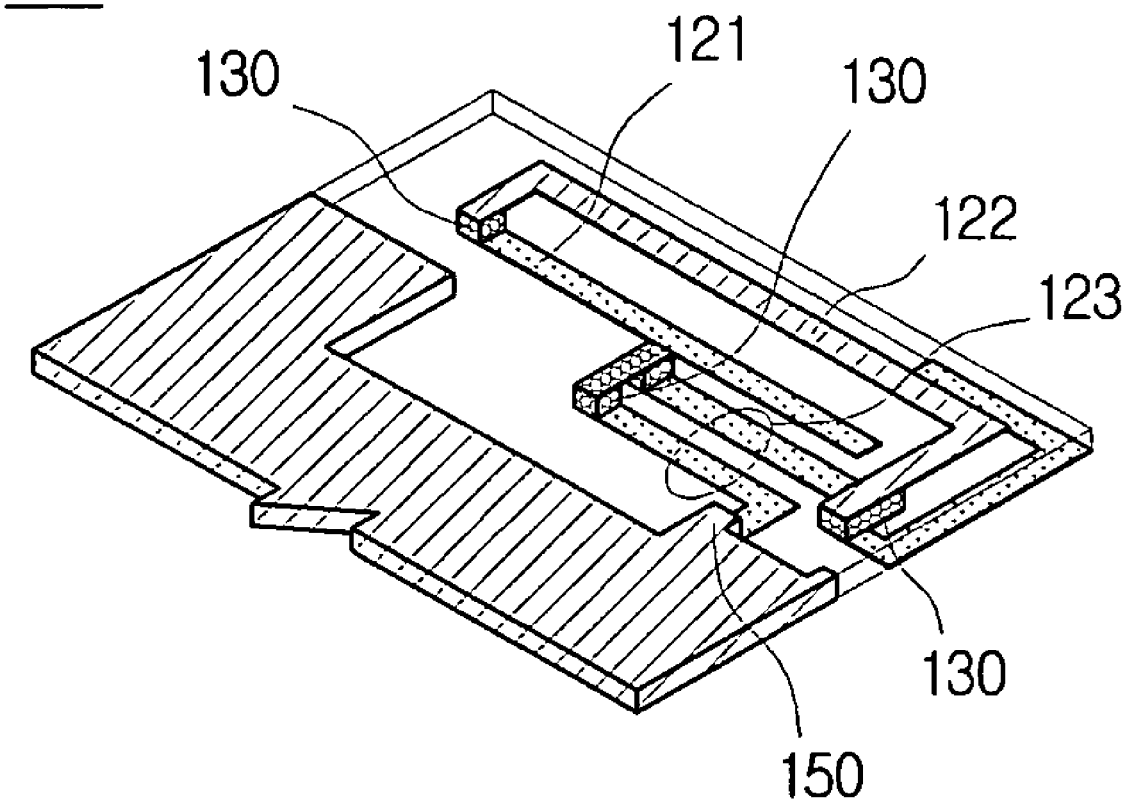
FIG. 4 is a bottom view of a printed circuit board having a built-in antenna according to an embodiment of the invention.

A description will now be provided as follows on a printed circuit board having a built-in antenna according to an embodiment of the invention, with reference to FIGS. 1 to 4. FIG. 1 is a schematic diagram of a printed circuit board having a built-in antenna according to an embodiment of the invention. FIG. 2 is a cross-sectional view of a printed circuit board having a built-in antenna according to an embodiment of the invention. FIG. 3 is a top view of a printed circuit board having a built-in antenna according to an embodiment of the invention. FIG. 4 is a bottom view of a printed circuit board having a built-in antenna according to an embodiment of the invention.

In FIGS. 1 to 4, there are illustrated a printed circuit board 110 having a built-in antenna, unit substrates 111, 112, an antenna 121, 122, a pair of striplines 123, vias 130, a connector pattern 131, a power supply part 140, and a ground 150.

This embodiment of the invention provides a printed circuit board 110 having a built-in antenna that may include multiple unit substrates 111, 112 stacked over each other. The printed circuit board may be formed not from a single unit substrate, but by stacking two or more unit substrates 111, 112.

Here, radiators may be formed in these multiple unit substrates 111, 112, where the descriptions for FIGS. 1 to 4 assume an example case in which the radiators are formed in two layers.

Referring to FIGS. 1 to 4, radiators 121, 122 may be formed in the multiple unit substrates 111, 112. As illustrated in FIGS. 2 to 4, each of the radiators 121, 122 can be formed in a different unit substrate. By forming the radiators in different unit substrates, the radiation efficiency of the printed circuit board having a built-in antenna can be increased.

In an antenna, parasitic capacitance (C) in the radiators may create resonance in undesired frequency bands, whereby the efficiency may be decreased. In this embodiment, however, as the radiators may be formed in multiple unit substrates, the parasitic capacitance may be lower compared to the parasitic capacitance created by radiators formed in a single unit substrate, so that the reductions in radiation efficiency can be minimized, and the radiation efficiency can be increased.

The radiators formed in the respective layers can have different frequency bands. That is, the frequency band used for communication by each of the radiators formed in the multiple unit substrates may be different. For example, if the frequency band for one of the radiators is GSM900, the frequency band for the other can be a DSC1800 band. The range of frequency bands available to each of the antennas may partially overlap each other.

In one embodiment of the invention, the frequency band of the radiator 122 formed in the same unit substrate 11 as the one in which the ground 150 is formed can be relatively lower than the frequency band of the radiator 121 formed in the unit substrate 112 in which the ground 150 is not formed.

Since the frequency used by the radiators formed in the printed circuit board according to an embodiment of the invention may be different, as described above, the printed circuit board can be applied not only to communication devices that use single frequency bands, but also to communication devices that use multiple frequency bands. Here, it is to be appreciated that the term "communication devices" encompass all forms of devices in which the use of an antenna is required.

A pair of striplines 123 may be formed in the unit substrate 112. Referring to FIG. 1, one end of a stripline 123 may be connected with the ground 150, while the other end may be connected with the radiator 122. Also, referring to FIG. 2, the pair of striplines 123 may each have one end connected to one side of a pair of vias 130, where the other side of the pair of vias 130 may be connected to each other by a connector pattern 131. The pair of striplines 123 may be used for impedance matching. This will be described later in further detail with reference to FIGS. 5 and 6.

A power supply part 140 may be connected by vias 130 with the pair of striplines 123 and the radiator 122. The power supply part 140 may serve to supply power to each of the radiators 121, 122.

The vias 130 may connect the radiators 121, 122, as well as the ground 150 and the pair of striplines 123, etc.

Figure 5:
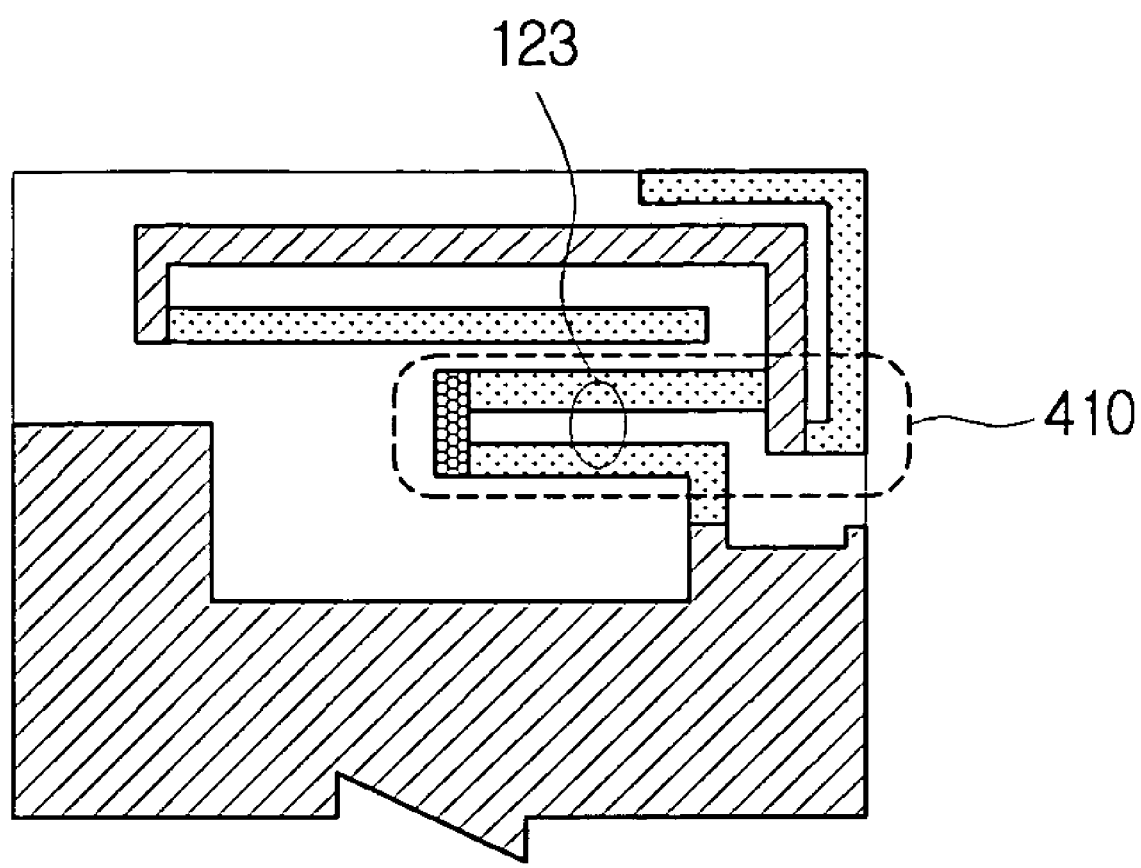
FIG. 5 is a schematic diagram of a printed circuit board having a built-in antenna according to an embodiment of the invention.

A description will now be provided as follows on impedance matching using the striplines in a printed circuit board having a built-in antenna according to an embodiment of the invention, with reference to FIGS. 5 and 6. FIG. 5 is a schematic diagram of a printed circuit board having a built-in antenna according to an embodiment of the invention, and FIG. 6 is an equivalent circuit diagram for a stripline portion formed in a printed circuit board having a built-in antenna according to an embodiment of the invention.

Figure 6:
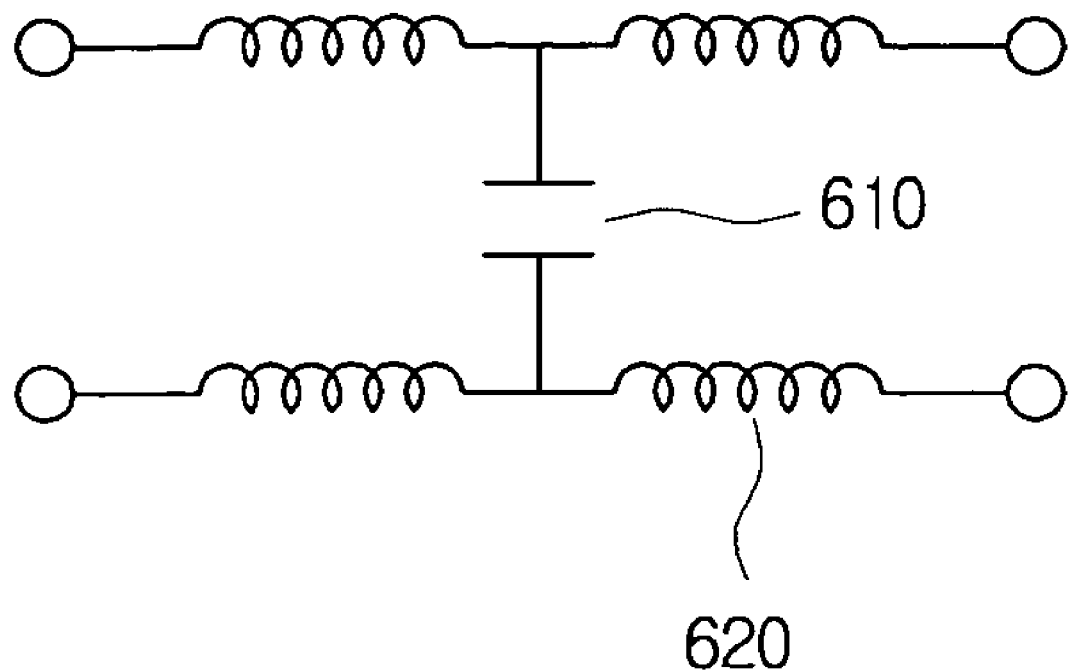
FIG. 6 is an equivalent circuit diagram for a stripline portion formed in a printed circuit board having a built-in antenna according to an embodiment of the invention.

An equivalent circuit diagram is presented in FIG. 6, for the pair of striplines 123 illustrated in the dotted area 410 in the drawing of the printed circuit board in FIG. 5. As described above, since the value of the parasitic capacitance (C) 610 or the inductance (L) 620 can be altered for tuning using the pair of striplines 123, impedance matching can be performed with greater ease, compared to a printed circuit board having a built-in antenna based on the related art.

Impedance matching refers to providing the conditions, when a source of power operates into a load, by which to minimize reflection of current or power at the contact points, or maximize power transfer to the load. In other words, impedance matching can refer to providing the conditions for maximum radiation efficiency in an antenna.

In order to maximize radiation efficiency in a printed circuit board having a built-in antenna based on an embodiment of the invention, impedance matching must be performed. In cases where impedance matching requires an increase in the parasitic capacitance value (C) 610, the gap between the pair of striplines 123 can be decreased, to increase the parasitic capacitance (C) 610. On the other hand, if it is desired to increase the inductance value (L) 620, this can be achieved by increasing the lengths of the pair of striplines 123. Thus, by adjusting the gap between and the lengths of the pair of striplines 123, the built-in antenna in the printed circuit board can be tuned for impedance matching. As such, by way of these tuning procedures, the printed circuit board having a built-in antenna can be made to have maximum radiation efficiency.

According to certain aspects of the invention as set forth above, a compact printed circuit board having a built-in antenna can be provided. The printed circuit board having a built-in antenna allows the use of multiple frequency bands with the addition only of a simple process, and without increases in cost.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A printed circuit board having a built-in antenna, the printed circuit board comprising:
   a first unit substrate having a ground and a first radiator formed therein;
   a second unit substrate stacked over the first unit substrate and having a second radiator formed therein, the second radiator having a frequency band different from a frequency band of the first radiator;
   a pair of striplines formed in the second unit substrate, the pair of strip lines connected with the ground;
   a first via connecting the first radiator with the second radiator;
   a pair of second vias each having one end thereof connected with the pair of strip lines respectively; and
   a connector pattern connecting other ends of each of the pair of second vias to each other.

2. The printed circuit board of claim 1, wherein the frequency band of the first radiator is lower than the frequency band of the second radiator.

3. The printed circuit board of claim 1, further comprising:
   a power supply part configured to supply power to the first radiator and the second radiator.

* * * * *